(12) United States Patent
Keene et al.

(10) Patent No.: US 12,140,641 B2
(45) Date of Patent: *Nov. 12, 2024

(54) METHOD AND SYSTEM FOR KEY PREDICTORS AND MACHINE LEARNING FOR CONFIGURING CELL PERFORMANCE

(71) Applicant: Enevate Corporation, Irvine, CA (US)

(72) Inventors: Sam Keene, Long Beach, CA (US); Giulia Canton, Irvine, CA (US); Ian Browne, Orange, CA (US); Xianyang Li, Irvine, CA (US); Hong Zhao, Aliso Viejo, CA (US); Benjamin Park, Mission Viejo, CA (US)

(73) Assignee: ENEVATE CORPORATION, Irvine, CA (US)

( * ) Notice: Subject to any disclaimer, the term of this patent is extended or adjusted under 35 U.S.C. 154(b) by 25 days.

This patent is subject to a terminal disclaimer.

(21) Appl. No.: 17/716,495

(22) Filed: Apr. 8, 2022

(65) Prior Publication Data

US 2022/0283243 A1 Sep. 8, 2022

Related U.S. Application Data

(63) Continuation of application No. 17/192,877, filed on Mar. 4, 2021, now Pat. No. 11,300,631.

(51) Int. Cl.
*G01R 31/396* (2019.01)
*G01R 31/367* (2019.01)
*G01R 31/392* (2019.01)

(52) U.S. Cl.
CPC ......... *G01R 31/396* (2019.01); *G01R 31/367* (2019.01); *G01R 31/392* (2019.01)

(58) Field of Classification Search
CPC .................................................. G01R 31/396
USPC ........................................ 324/426, 432–435
See application file for complete search history.

(56) References Cited

U.S. PATENT DOCUMENTS

| | | |
|---|---|---|
| 6,358,289 B1 | 3/2002 | Fauteux et al. |
| 10,664,562 B2 * | 5/2020 | Balasingam ....... G01R 31/3842 |
| 2012/0215337 A1 | 8/2012 | Hsu et al. |

(Continued)

OTHER PUBLICATIONS

International Search Report and Written Opinion for PCT/US2021/061736, mailed Jan. 11, 2022, 8 pages.

(Continued)

*Primary Examiner* — Vincent Q Nguyen
(74) *Attorney, Agent, or Firm* — McAndrews, Held & Malloy, Ltd.

(57) ABSTRACT

Methods and systems are provided for key predictors and machine learning for configuring cell performance. One or more parameters relating to the cell may be measured, via a measurement apparatus, with the cell including a cathode, a separator, and a silicon-dominant anode, and the cell may be managed, based on the one or more parameters, with the managing including predetermining cycle life of the cell based on the one or more parameters using a machine learning model. The cell may be within a battery pack that includes a plurality of cells. The battery pack may be in an electric vehicle. At least one parameter may be measured before a formation process of the cell. At least one parameter may be measured during the formation process. At least one parameter may be measured during cycling of the cell.

14 Claims, 8 Drawing Sheets

(56) References Cited

U.S. PATENT DOCUMENTS

| | | | |
|---|---|---|---|
| 2013/0268466 A1* | 10/2013 | Baek | G01R 31/392 |
| | | | 706/12 |
| 2017/0214054 A1 | 7/2017 | Cui et al. | |
| 2018/0006329 A1 | 1/2018 | Xiao et al. | |
| 2019/0157668 A1 | 5/2019 | Moon | |
| 2019/0356026 A1 | 11/2019 | Zhu et al. | |
| 2021/0091583 A1 | 3/2021 | Kamijima | |
| 2021/0143481 A1* | 5/2021 | Park | C09D 5/24 |
| 2022/0074993 A1* | 3/2022 | Aykol | B60L 58/10 |

OTHER PUBLICATIONS

Jichao Hong, et al., "Online accurate state of health estimation for battery systems on real-world electric vehicles with variable driving conditions considered", Journal of Cleaner Production, Jan. 6, 2021, 16 pages.

Xiong Feng, et al., "State-of-charge estimation of lithium-ion battery based on clockwork recurrent neural network", Energy, Jul. 3, 2021, 10 pages.

Yihuan Li, et al., "Lithium-ion battery capacity estimation—A pruned convolutional neural network approach assisted with transfer learning", Applied Energy, Jan. 4, 2021, 13 pages.

Kodjo S.R. Mawonou, Akram Eddahech, Didier Dumur, Dominique Beauvois, Emmanuel Godoy. "State-of-health estimators coupled to a random forest approach for lithium-ion battery aging factor ranking", Journal of Power Sources, Elsevier, Jan. 10, 2021, 28 pages.

* cited by examiner

METHOD AND SYSTEM FOR KEY PREDICTORS AND MACHINE LEARNING FOR CONFIGURING CELL PERFORMANCE

CLAIM OF PRIORITY

This application is a continuation of U.S. patent application Ser. No. 17/192,877 filed on Mar. 4, 2021. The above identified application is hereby incorporated by reference it its entirety.

FIELD

Aspects of the present disclosure relate to energy generation and storage. More specifically, certain embodiments of the disclosure relate to a method and system for key predictors and machine learning for configuring cell performance.

BACKGROUND

Conventional approaches for battery configuration may be costly, cumbersome, and/or inefficient—e.g., they may be complex and/or time consuming to implement, and may limit battery lifetime.

Further limitations and disadvantages of conventional and traditional approaches will become apparent to one of skill in the art, through comparison of such systems with some aspects of the present disclosure as set forth in the remainder of the present application with reference to the drawings.

BRIEF SUMMARY

A system and/or method for key predictors and machine learning for configuring cell performance, substantially as shown in and/or described in connection with at least one of the figures, as set forth more completely in the claims.

These and other advantages, aspects and novel features of the present disclosure, as well as details of an illustrated embodiment thereof, will be more fully understood from the following description and drawings.

DETAILED DESCRIPTION OF THE INVENTION

Figure 1:
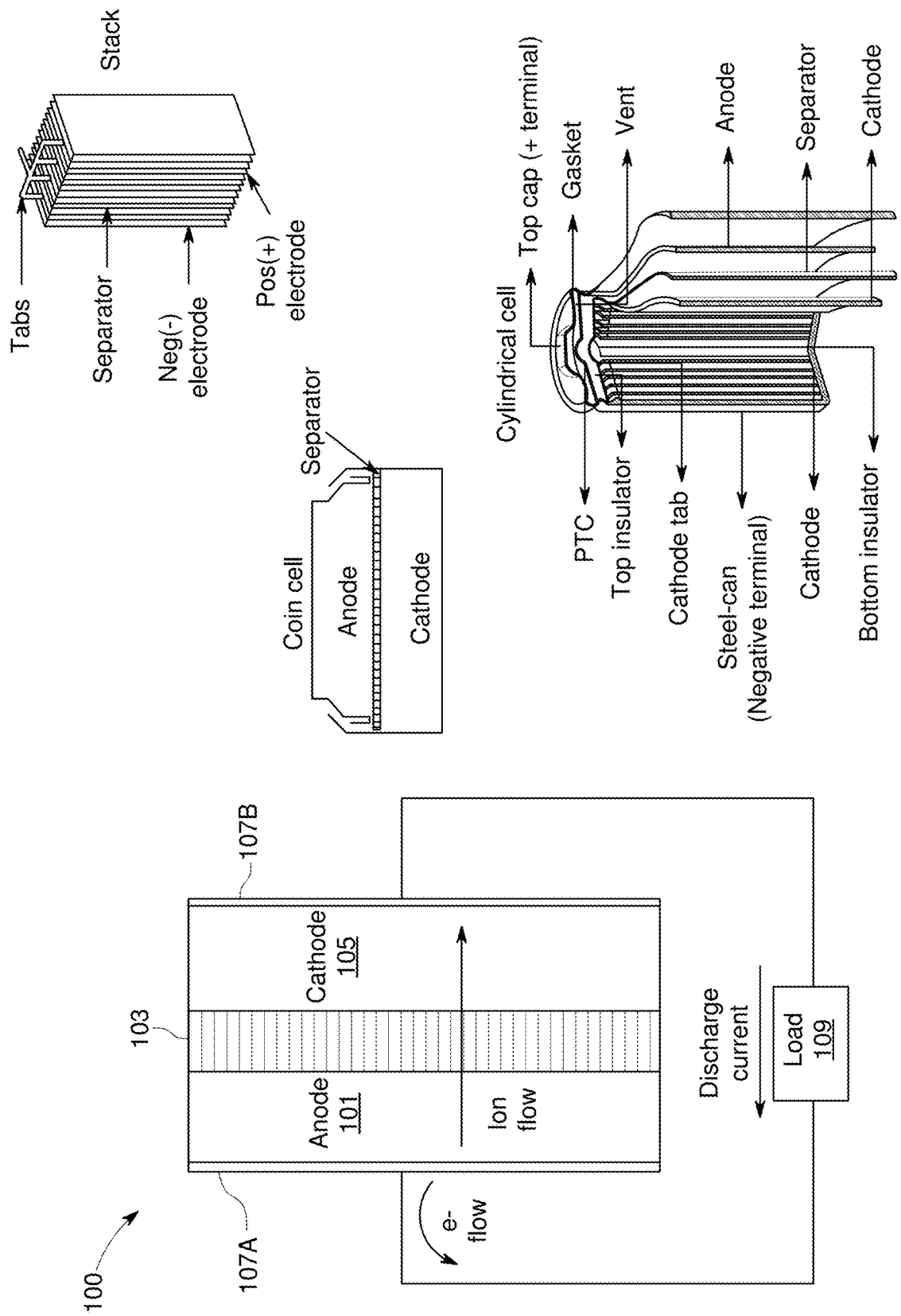
FIG. 1 is a diagram of a battery, in accordance with an example embodiment of the disclosure.

FIG. 1 is a diagram of a battery with silicon-dominant anodes, in accordance with an example embodiment of the disclosure. Referring to FIG. 1, there is shown a battery 100 comprising a separator 103 sandwiched between an anode 101 and a cathode 105, with current collectors 107A and 107B. There is also shown a load 109 coupled to the battery 100 illustrating instances when the battery 100 is in discharge mode. In this disclosure, the term "battery" may be used to indicate a single electrochemical cell, a plurality of electrochemical cells formed into a module, and/or a plurality of modules formed into a pack. Furthermore, the battery 100 shown in FIG. 1 is a very simplified example merely to show the principle of operation of a lithium ion cell. Examples of realistic structures are shown to the right in FIG. 1, where stacks of electrodes and separators are utilized, with electrode coatings typically on both sides of the current collectors. The stacks may be formed into different shapes, such as a coin cell, cylindrical cell, or prismatic cell, for example.

The development of portable electronic devices and electrification of transportation drive the need for high performance electrochemical energy storage. Small-scale (<100 Wh) to large-scale (>10 KWh) devices primarily use lithium-ion (Li-ion) batteries over other rechargeable battery chemistries due to their high-performance.

The anode 101 and cathode 105, along with the current collectors 107A and 107B, may comprise the electrodes, which may comprise plates or films within, or containing, an electrolyte material, where the plates may provide a physical barrier for containing the electrolyte as well as a conductive contact to external structures. In other embodiments, the anode/cathode plates are immersed in electrolyte while an outer casing provides electrolyte containment. The anode 101 and cathode are electrically coupled to the current collectors 107A and 107B, which comprise metal or other conductive material for providing electrical contact to the electrodes as well as physical support for the active material in forming electrodes.

The configuration shown in FIG. 1 illustrates the battery 100 in discharge mode, whereas in a charging configuration, the load 109 may be replaced with a charger to reverse the process. In one class of batteries, the separator 103 is generally a film material, made of an electrically insulating polymer, for example, that prevents electrons from flowing from anode 101 to cathode 105, or vice versa, while being porous enough to allow ions to pass through the separator 103. Typically, the separator 103, cathode 105, and anode 101 materials are individually formed into sheets, films, or active material coated foils. Sheets of the cathode, separator and anode are subsequently stacked or rolled with the separator 103 separating the cathode 105 and anode 101 to form the battery 100. In some embodiments, the separator 103 is a sheet and generally utilizes winding methods and stacking in its manufacture. In these methods, the anodes, cathodes, and current collectors (e.g., electrodes) may comprise films.

In an example scenario, the battery 100 may comprise a solid, liquid, or gel electrolyte. The separator 103 preferably does not dissolve in typical battery electrolytes such as compositions that may comprise: Ethylene Carbonate (EC), Fluoroethylene Carbonate (FEC), Propylene Carbonate (PC), Dimethyl Carbonate (DMC), Ethyl Methyl Carbonate (EMC), Diethyl Carbonate (DEC), etc. with dissolved $LiBF_4$, $LiAsF_6$, $LiPF_6$, and $LiClO_4$ etc. In an example scenario, the electrolyte may comprise Lithium hexafluorophosphate ($LiPF_6$) and lithium bis(trifluoromethanesulfonyl)imide (LiTFSI) that may be used together in a variety of electrolyte solvents. Lithium hexafluorophosphate ($LiPF_6$) may be present at a concentration of about 0.1 to 2.0 molar (M) and lithium bis(trifluoromethanesulfonyl)imide (LiTFSI) may be present at a concentration of about 0 to 2.0 molar (M). Solvents may comprise one or more of ethylene carbonate (EC), fluoroethylene carbonate (FEC) and/or ethyl methyl carbonate (EMC) in various percentages. In some embodiments, the electrolyte solvents may comprise one or more of EC from about 0-40%, FEC from about 2-40% and/or EMC from about 50-70% by weight.

The separator 103 may be wet or soaked with a liquid or gel electrolyte. In addition, in an example embodiment, the separator 103 does not melt below about 100 to 120° C., and exhibits sufficient mechanical properties for battery applications. A battery, in operation, can experience expansion and contraction of the anode and/or the cathode. In an example embodiment, the separator 103 can expand and contract by at least about 5 to 10% without failing, and may also be flexible.

The separator 103 may be sufficiently porous so that ions can pass through the separator once wet with, for example, a liquid or gel electrolyte. Alternatively (or additionally), the separator may absorb the electrolyte through a gelling or other process even without significant porosity. The porosity of the separator 103 is also generally not too porous to allow the anode 101 and cathode 105 to transfer electrons through the separator 103.

The anode 101 and cathode 105 comprise electrodes for the battery 100, providing electrical connections to the device for transfer of electrical charge in charge and discharge states. The anode 101 may comprise silicon, carbon, or combinations of these materials, for example. Typical anode electrodes comprise a carbon material that includes a current collector such as a copper sheet. Carbon is often used because it has excellent electrochemical properties and is also electrically conductive. Anode electrodes currently used in rechargeable lithium-ion cells typically have a specific capacity of approximately 200 milliamp hours per gram. Graphite, the active material used in most lithium ion battery anodes, has a theoretical energy density of 372 milliamp hours per gram (mAh/g). In comparison, silicon has a high theoretical capacity of 4200 mAh/g. In order to increase volumetric and gravimetric energy density of lithium-ion batteries, silicon may be used as the active material for the cathode or anode. Silicon anodes may be formed from silicon composites, with more than 50% silicon or more by weight in the anode material on the current collector, for example.

In an example scenario, the anode 101 and cathode 105 store the ion used for separation of charge, such as lithium. In this example, the electrolyte carries positively charged lithium ions from the anode 101 to the cathode 105 in discharge mode, as shown in FIG. 1 for example, and vice versa through the separator 105 in charge mode. The movement of the lithium ions creates free electrons in the anode 101 which creates a charge at the positive current collector 107B. The electrical current then flows from the current collector through the load 109 to the negative current collector 107A. The separator 103 blocks the flow of electrons inside the battery 100, allows the flow of lithium ions, and prevents direct contact between the electrodes.

While the battery 100 is discharging and providing an electric current, the anode 101 releases lithium ions to the cathode 105 via the separator 103, generating a flow of electrons from one side to the other via the coupled load 109. When the battery is being charged, the opposite happens where lithium ions are released by the cathode 105 and received by the anode 101.

The materials selected for the anode 101 and cathode 105 are important for the reliability and energy density possible for the battery 100. The energy, power, cost, and safety of current Li-ion batteries need to be improved in order to, for example, compete with internal combustion engine (ICE) technology and allow for the widespread adoption of electric vehicles (EVs). High energy density, high power density, and improved safety of lithium-ion batteries are achieved with the development of high-capacity and high-voltage cathodes, high-capacity anodes and functionally non-flammable electrolytes with high voltage stability and interfacial compatibility with electrodes. In addition, materials with low toxicity are beneficial as battery materials to reduce process cost and promote consumer safety.

The performance of electrochemical electrodes, while dependent on many factors, is largely dependent on the robustness of electrical contact between electrode particles, as well as between the current collector and the electrode particles. The electrical conductivity of silicon anode electrodes may be manipulated by incorporating conductive additives with different morphological properties. Carbon black (SuperP), vapor grown carbon fibers (VGCF), and a mixture of the two have previously been incorporated separately into the anode electrode resulting in improved performance of the anode. The synergistic interactions between the two carbon materials may facilitate electrical contact throughout the large volume changes of the silicon anode during charge and discharge.

State-of-the-art lithium-ion batteries typically employ a graphite-dominant anode as an intercalation material for lithium. Silicon-dominant anodes, however, offer improvements compared to graphite-dominant Li-ion batteries. Silicon exhibits both higher gravimetric (4200 mAh/g vs. 372 mAh/g for graphite) and volumetric capacities (2194 mAh/L vs. 890 mAh/L for graphite). In addition, silicon-based anodes have a low lithiation/delithiation voltage plateau at about 0.3-0.4V vs. Li/Li+, which allows it to maintain an open circuit potential that avoids undesirable Li plating and dendrite formation. While silicon shows excellent electrochemical activity, achieving a stable cycle life for silicon-based anodes is challenging due to silicon's large volume changes during lithiation and delithiation. Silicon regions may lose electrical contact from the anode as large volume changes coupled with its low electrical conductivity separate the silicon from surrounding materials in the anode.

In addition, the large silicon volume changes exacerbate solid electrolyte interphase (SEI) formation, which can further lead to electrical isolation and, thus, capacity loss. Expansion and shrinkage of silicon particles upon charge-discharge cycling causes pulverization of silicon particles, which increases their specific surface area. As the silicon surface area changes and increases during cycling, SEI repeatedly breaks apart and reforms. The SEI thus continually builds up around the pulverizing silicon regions during cycling into a thick electronic and ionic insulating layer. This accumulating SEI increases the impedance of the electrode and reduces the electrode electrochemical reactivity, which is detrimental to cycle life.

Cell cycle life is an important parameter, no matter the application of the cell. Multiple variables may impact the cell life, and it may be difficult to determine at the time of fabrication of a particular cell, how long it will last. Various parameters that may be correlated to cell life comprise early cell impedance, open circuit voltage, thickness, initial coulombic efficiency (discharge capacity/charge capacity), formation cycle charge capacity, formation cycle discharge capacity, difference between voltage curves at particular cycle numbers, and maximum voltage reached during the first 10% of the first formation charge cycle, for example.

In an example embodiment, data may be taken from a plurality of cells and using machine learning, a model may be generated that may be utilized to predict cell performance. In this manner, cells may be binned in different performance level categories when manufactured with consistent performance for cells selected from the same bin, without waiting for weeks or months for cycle data.

In this disclosure, a wide number of parameters are utilized in machine learning models to predict performance, with five categories of inputs: 1) measurements of the cells or cell components before formation or cycling such as impedance values, open circuit voltage values, cell thickness; 2) features taken/measured from the formation cycles such as voltage values, and coulombic efficiency during formation; 3) data taken from the first ten cycles, including discharge capacity, charge capacity, coulombic efficiency, resistance values (one data point per cycle); 4) statistical measurements comparing two different voltage curves within the first 10 cycles; and 5) measurements of characteristics of the cell components prior to cell assembly including characteristics of the raw materials used to fabricate the cells, physical properties of the electrolyte, or fundamental characteristics of the electrodes such as resistance, roughness, or mechanical strength.

Figure 2A:
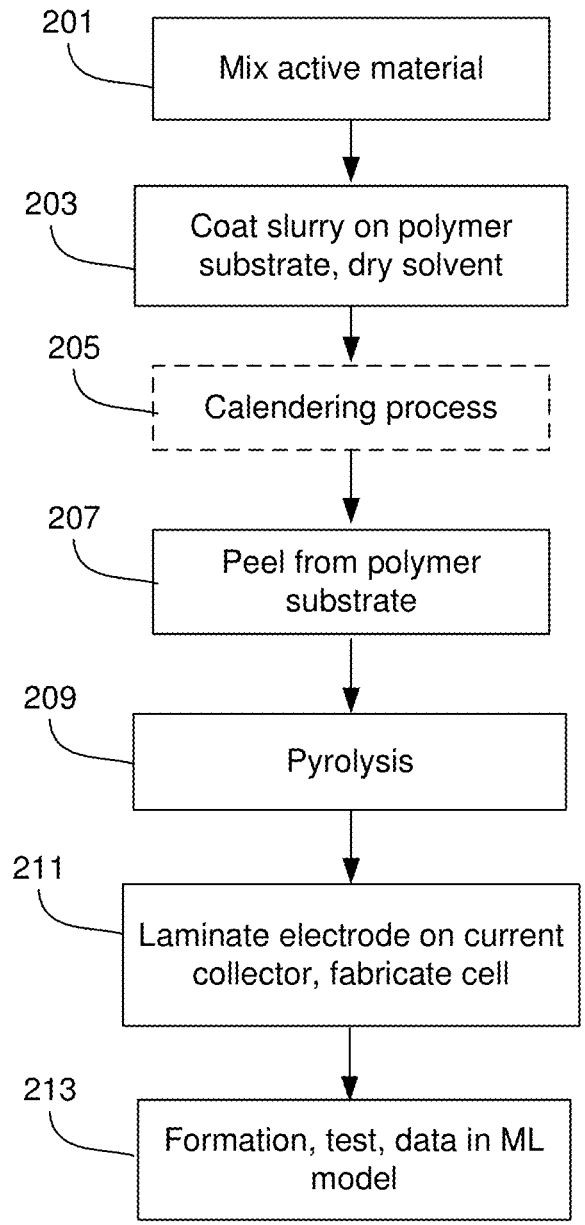
FIG. 2A is a flow diagram of a lamination process for forming a silicon-dominant anode cell, in accordance with an example embodiment of the disclosure.

FIG. 2A is a flow diagram of a lamination process for forming a silicon-dominant anode cell, in accordance with an example embodiment of the disclosure. This process employs a high-temperature pyrolysis process on a substrate, layer removal, and a lamination process to adhere the active material layer to a current collector.

The raw electrode active material is mixed in step 201. In the mixing process, the active material may be mixed, e.g., a binder/resin (such as PI, PAI), solvent, and conductive additives. The materials may comprise carbon nanotubes/fibers, graphene sheets, metal polymers, metals, semiconductors, and/or metal oxides, for example. Silicon powder with a 1-30 or 5-30 μm particle size, for example, may then be dispersed in polyamic acid resin (15% solids in N-Methyl pyrrolidone (NMP)) at, e.g., 1000 rpm for, e.g., 10 minutes, and then the conjugated carbon/NM P slurry may be added and dispersed at, e.g., 2000 rpm for, e.g., 10 minutes to achieve a slurry viscosity within 2000-4000 cP and a total solid content of about 30%.

In step 203, the slurry may be coated on a substrate. In this step, the slurry may be coated onto a Polyester, polyethylene terephthalate (PET), or Mylar film at a loading of, e.g., 2-4 mg/cm$^2$ and then undergo drying to an anode coupon with high Si content and less than 15% residual solvent content. This may be followed by an optional calendering process in step 205, where a series of hard pressure rollers may be used to finish the film/substrate into a smoothed and denser sheet of material.

In step 207, the green film may then be removed from the PET, where the active material may be peeled off the polymer substrate, the peeling process being optional for a polypropylene (PP) substrate, since PP can leave ~2% char residue upon pyrolysis. The peeling may be followed by a pyrolysis step 209 where the material may be heated to 600-1250 C for 1-3 hours, cut into sheets, and vacuum dried using a two-stage process (120° C. for 15 h, 220° C. for 5 h).

In step 211, the electrode material may be laminated on a current collector. For example, a 5-20 μm thick copper foil may be coated with polyamide-imide with a nominal loading of, e.g., 0.2-0.6 mg/cm$^2$ (applied as a 6 wt % varnish in NMP and dried for, e.g., 12-18 hours at, e.g., 110° C. under vacuum). The anode coupon may then be laminated on this adhesive-coated current collector. In an example scenario, the silicon-carbon composite film is laminated to the coated copper using a heated hydraulic press. An example lamination press process comprises 30-70 seconds at 300° C. and 3000-5000 psi, thereby forming the finished silicon-composite electrode.

In step 213, the cell may be assessed before being subject to a formation process. The measurements may comprise impedance values, open circuit voltage, and thickness measurements. During formation, the initial lithiation of the anode may be performed, followed by delithiation. Cells may be clamped during formation and/or early cycling. The formation cycles are defined as any type of charge/discharge of the cell that is performed to prepare the cell for general cycling and is considered part of the cell production process. Different rates of charge and discharge may be utilized in formation steps. During formation, various cell measurements may comprise initial coulombic efficiency, which is the discharge capacity divided by the charge capacity, the formation cycle charge capacity, and formation cycle discharge capacity. Other measurements comprise voltage reached during the first 10% of the first formation cycle and comparisons between cell voltage curves during any portion of the formation cycle. Data collected on the cell before and during formation may be utilized with a machine learning model to predict the cell's performance during its lifetime.

Figure 2B:
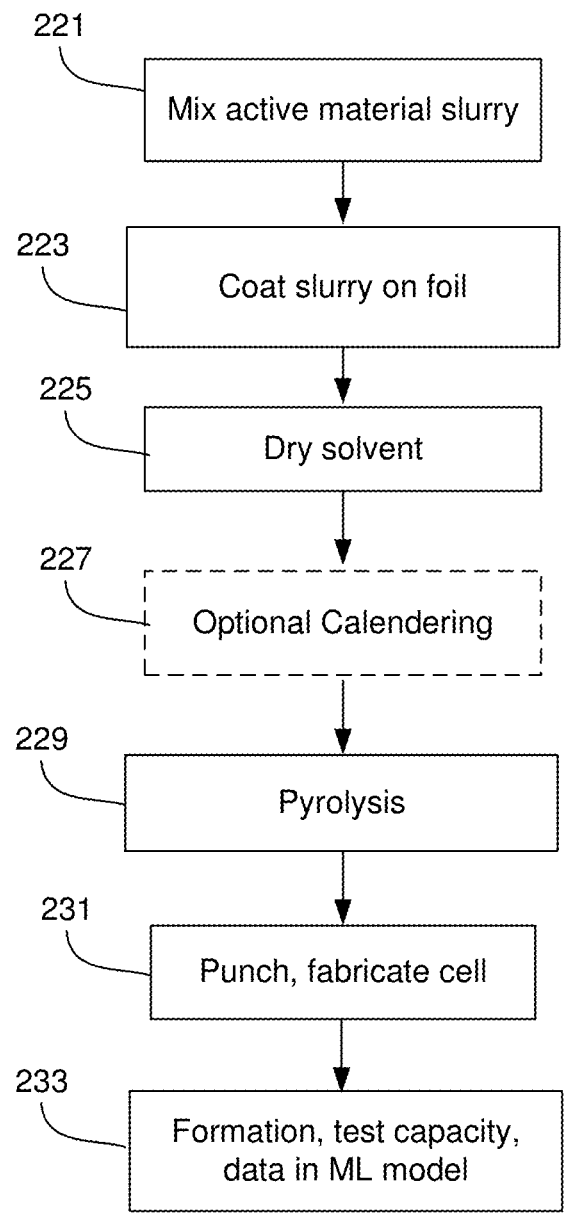
FIG. 2B is a flow diagram of a direct coating process for forming a silicon-dominant anode cell, in accordance with an example embodiment of the disclosure.

FIG. 2B is a flow diagram of a direct coating process for forming a silicon-dominant anode cell, in accordance with an example embodiment of the disclosure. This process comprises physically mixing the active material, conductive additive, and binder together, and coating it directly on a current collector before pyrolysis. This example process comprises a direct coating process in which an anode or cathode slurry is directly coated on a copper foil using a binder such as CMC, SBR, Sodium Alginate, PAI, PI and mixtures and combinations thereof.

In step 221, the active material may be mixed, e.g., a binder/resin (such as PI, PAI), solvent, and conductive additives. The materials may comprise carbon nanotubes/fibers, graphene sheets, metal polymers, metals, semiconductors, and/or metal oxides, for example. Silicon powder with a 5-30 μm particle size, for example, may then be dispersed in polyamic acid resin (15% solids in N-Methyl pyrrolidone (NMP)) at, e.g., 1000 rpm for, e.g., 10 minutes, and then the conjugated carbon/NMP slurry may be added and dispersed at, e.g., 2000 rpm for, e.g., 10 minutes to achieve a slurry viscosity within 2000-4000 cP and a total solid content of about 30%.

Furthermore, cathode active materials may be mixed in step 221, where the active material may comprise lithium cobalt oxide (LCO), lithium iron phosphate, lithium nickel cobalt manganese oxide (NMC), lithium nickel cobalt aluminum oxide (NCA), lithium manganese oxide (LMO), lithium nickel manganese spinel, or similar materials or combinations thereof, mixed with a binder as described above for the anode active material.

In step 223, the slurry may be coated on a copper foil. In the direct coating process described here, an anode slurry is coated on a current collector with residual solvent followed by a calendaring process for densification followed by pyrolysis (~500-800 C) such that carbon precursors are partially or completely converted into glassy carbon. Similarly, cathode active materials may be coated on a foil material, such as aluminum, for example. The active material layer may undergo a drying in step 225 resulting in reduced residual solvent content. An optional calendering process may be utilized in step 227 where a series of hard pressure rollers may be used to finish the film/substrate into a smoother and denser sheet of material. In step 227, the foil and coating proceeds through a roll press for lamination.

In step 229, the active material may be pyrolyzed by heating to 500-1000° C. such that carbon precursors are partially or completely converted into glassy carbon. Pyrolysis can be done either in roll form or after punching. If done in roll form, the punching is done after the pyrolysis process. The pyrolysis step may result in an anode active material having silicon content greater than or equal to 50% by weight, where the anode has been subjected to heating at or above 400 degrees Celsius. In an example scenario, the anode active material layer may comprise 20 to 95% silicon and in yet another example scenario may comprise 50 to 95% silicon by weight. In instances where the current collector foil is not pre-punched/pre-perforated, the formed electrode may be perforated with a punching roller, for example. The punched electrodes may then be sandwiched with a separator and electrolyte to form a cell.

In step 233, the cell may be assessed before being subject to a formation process. The measurements may comprise impedance values, open circuit voltage, and thickness measurements. During formation, the initial lithiation of the anode may be performed, followed by delithiation. Cells may be clamped during formation and/or early cycling. The formation cycles are defined as any type of charge/discharge of the cell that is performed to prepare the cell for general cycling and is considered part of the cell production process. Different rates of charge and discharge may be utilized in formation steps. During formation, various cell measurements may be made with data analyzed using a machine learning model to predict the cell's performance during its lifetime.

Figure 3:
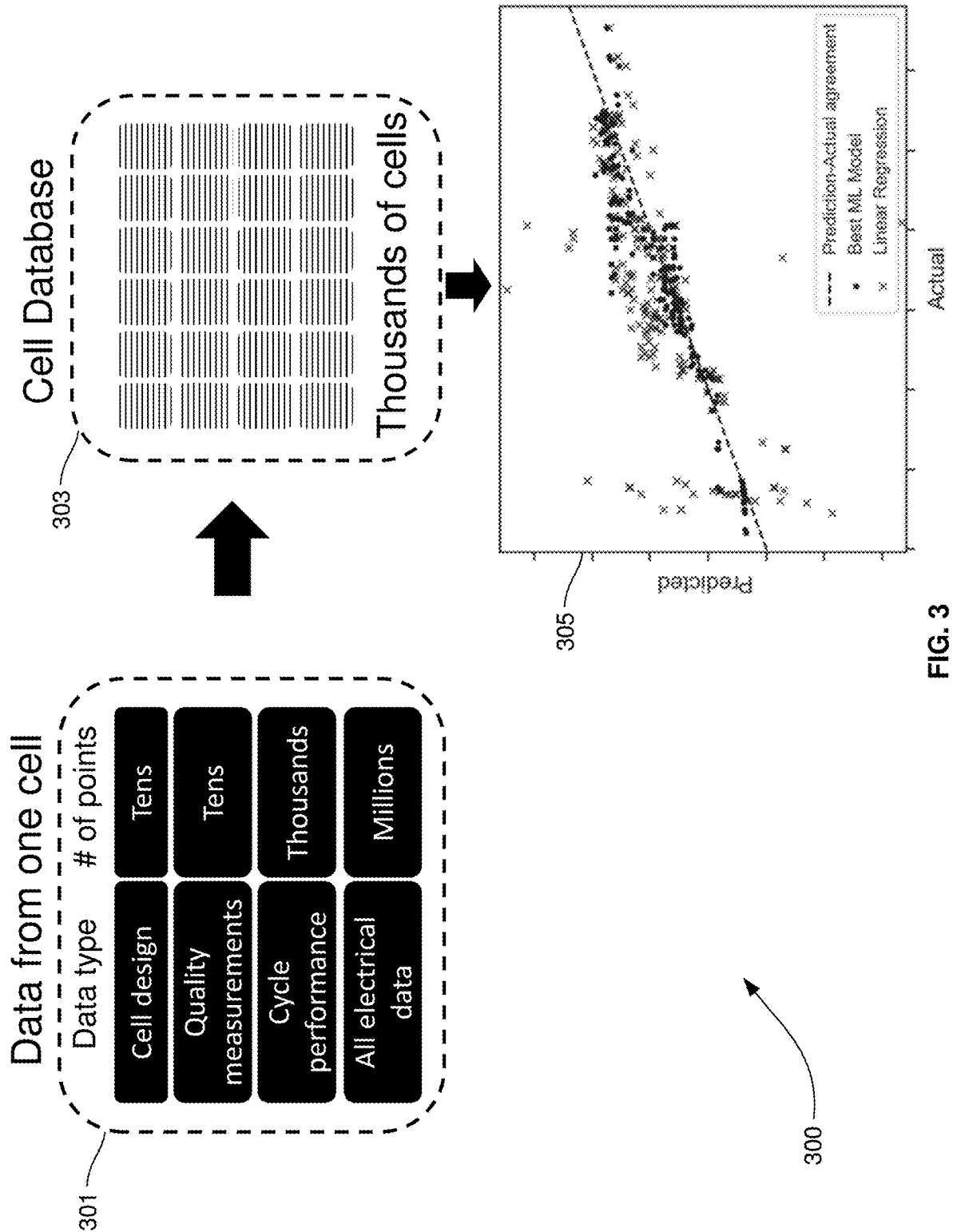
FIG. 3 illustrates a machine learning model for predicting battery performance, in accordance with an example embodiment of the disclosure.

FIG. 3 illustrates a machine learning model for predicting battery performance, in accordance with an example embodiment of the disclosure. Referring to FIG. 3, there is shown machine learning process 300 comprising data 301 measured from a single cell, a cell database 303, and resulting models 305. The types of data in the data 301 may comprise the cell design (type of anode/cathode, separator, electrolyte, etc.), quality measurements, cycle performance, and electrical data. The amount of these types of data range from tens for cell design and quality measurements, to the thousands for cycle performance, to millions for electrical data. The measurements may comprise largely electrical measurements, made with an apparatus with multimeter capability for taking current, voltage, and impedance measurements. Other example measurements may comprise physical measurements, such as thickness/volume, temperature, and pressure. The data may include information about the cell components prior to cell assembly, such as physical properties of the raw materials or of the individual electrodes or electrolyte The machine learning model 305 comprises a cell performance predictor with one or multiple input data features, and may be trained using Machine Learning (ML) algorithms. The model can perform either regression (prediction of a continuous value) or classification (prediction of a categorical value). The performance metrics include, but are not limited to: number of cycles above a capacity threshold, total cycled capacity, total cycled energy, total cycled energy density, number of cycles below a resistance threshold, and number of cycles below a thickness threshold.

The machine learning algorithms used to train the model include, but are not limited to: linear regression, logistic regression, lasso regression, AdaBoost regression, AdaBoost classification, XGBoost regression, XGBoost classification, Random Forest regression, Random forest classification, Multi-layer perception, long-short-term-memory neural networks, and Bayesian networks. Models that are trained using machine learning algorithms other than linear or logistic regression achieve better performance than linear or logistic regression, with performances defined by any of the following: R-squared value, root-mean-squared error, average error, receiver operating characteristic analysis (for classification).

The model input may, but does not have to, comprise only data acquired before the cell has undergone any cycling. In some cases, the model may predict the performance of cells that have different cell design (different combinations of anode, cathode, separator, electrolyte, cell size, number of electrode layers, cell form factor) than the cells in the data used to train the model. In an example embodiment, the data may comprise may any characteristic or measurement of the individual components of the cells prior to cell assembly, or of the raw materials used to fabricate those components. For example, for electrodes, the data may comprise loading, conductivity, mechanical strength, wettability, pyrolysis temperature, resin formulation, active material type, and active material particle size. For electrolytes, the data may comprise conductivity, viscosity, and formulation, whereas for separators the data may comprise porosity and tortuosity, for example.

The following data features may be used as input in any combination by the machine learning model. They generally fall into five categories, but the placement of features into these categories does not affect how they are used in the model. Category 1) comprises cell measurements NOT acquired during cycling, which are measurements of cell properties that are not collected while current is flowing through the cell, and may comprise: 1) Impedance, 2) open circuit voltage, and 3) thickness. These measurements may be acquired multiple times during the preparation of the cell; each measurement occurrence may comprise a unique feature. Measurement occurrences may comprise, but are not limited to: after clamping, after degassing, after formation, and unclamped before degassing. Degassing occurs when a cell generates gas products during formation and/or initial cycles, with the gas removed from the cell.

In category 2), the machine learning model 305 may utilize cell measurements acquired during formation. These are measurements taken during the formation cycle(s) of the cell but not during the subsequent cycling. The formation cycles may be defined as any type of charge/discharge of the cell that is performed to prepare the cell for general cycling and is considered part of the cell production process. These measurements may comprise initial coulombic efficiency, which is the discharge capacity divided by the charge capacity, the formation cycle charge capacity, and formation cycle discharge capacity. Other measurements comprise voltage reached during the first 10% of the first formation cycle and comparisons between cell voltage curves during any portion of the formation cycle.

Statistical calculations may also be performed on the difference between the cell voltage curve during any portion of the formation cycle(s) and the voltage curve of a reference cell's formation cycle. The voltage curve may be defined as the voltage vs. capacity data points that are acquired as the cell is cycled. The cell voltage curve and reference voltage curve may be interpolated to have either identical capacity values or identical voltage values. The curves may then be compared at each of these values. The following calculations on the comparison between the cell and reference curve may be used: maximum cell minus reference, maximum reference minus cell, mean cell minus reference, mean-squared cell minus reference, and variance of cell minus reference.

Category 3) may comprise discrete cycling features. These are data points that may be collected on a per-cycle basis, measured during the charge/discharge of the cell. The features may be collected from any cycle number and from multiple cycle numbers. Each cycle number/data type combination comprises a unique feature. Typically, features may be extracted from cycle numbers ten and below, but there is no limitation of the cycle number(s) used. Parameters may comprise discharge capacity, charge capacity, coulombic efficiency, resistance, duration of a constant-current portion of a cycle, duration of a constant-voltage portion of a cycle, midpoint voltage (the voltage at the 50% capacity point of a cycle), voltage after a rest (zero current) portion of a cycle, capacity at a specific voltage, and temperature at a specific voltage or capacity.

Category 4) may comprise statistical calculations performed on the difference between voltage curves from two different cycle numbers is yet another example parameter. The voltage curve is defined as the voltage vs. capacity data points that are acquired as the cell is cycled. The two voltage curves may be interpolated to have either identical capacity values or identical voltage values. The curves may then be compared at each of these values. Typically, features may be extracted from cycle numbers ten and below, but there is no limitation of the cycle number(s) used.

Category 5) may comprise any characteristic or measurement of the individual components of the cells prior to cell assembly, or of the raw materials used to fabricate those components. The range of possible data in this category is broad but some examples include: for electrodes: loading, conductivity, mechanical strength, wettability, pyrolysis temperature, resin formulation, active material type, active material particle size; for electrolytes: conductivity, viscosity, formulation; for separators: porosity, tortuosity.

In one example "cycle x" is denoted as the lower cycle number and "cycle y" as the higher cycle number. Example parameters may comprise maximum cycle x minus cycle y, maximum negative cycle x minus cycle y, mean cycle x minus cycle y, variance cycle x minus cycle y, Log variance cycle x minus cycle y, reciprocal of cycle x minus cycle y.

In certain cases, good results may be achieved using only data from categories 1) and 5), parameters measured when not cycling, and in a slightly larger number of cases, only data from categories 1), 2), and 5) also including measurements during formation. One of the main advantages of the machine learning model described here is that it works across different cell designs and predicts the performance of the cell before it has undergone any operation.

The models 305 illustrate results for a linear regression model, shown by the "X" points on the plot and the machine learning model, shown by the circles, where the y-axis is the predicted performance and the x-axis is the actual result. The machine learning model shows much better prediction capability with a root-mean-square error of 14 compared to the linear regression root-mean-square error of 57.

FIGS. 4A-4D illustrates cycle performance predictions versus actual performance for four different systems with different anode and cathode combinations, in accordance with an example embodiment of the disclosure. Here the data shows across four different systems, with different anode cathode combinations, when the cells were cycled at different depths of charge and/or discharge state, where the cycle life to 80% capacity retention is well correlated with the coulombic efficiency in the second charge/discharge cycle. This model predicts cycle life based on the result of just a few cycles, and potentially saves time, money and resources, as well as increase research/development speed. The second cycle measurement may be performed during formation and/or regular cycling.

Figure 4A:
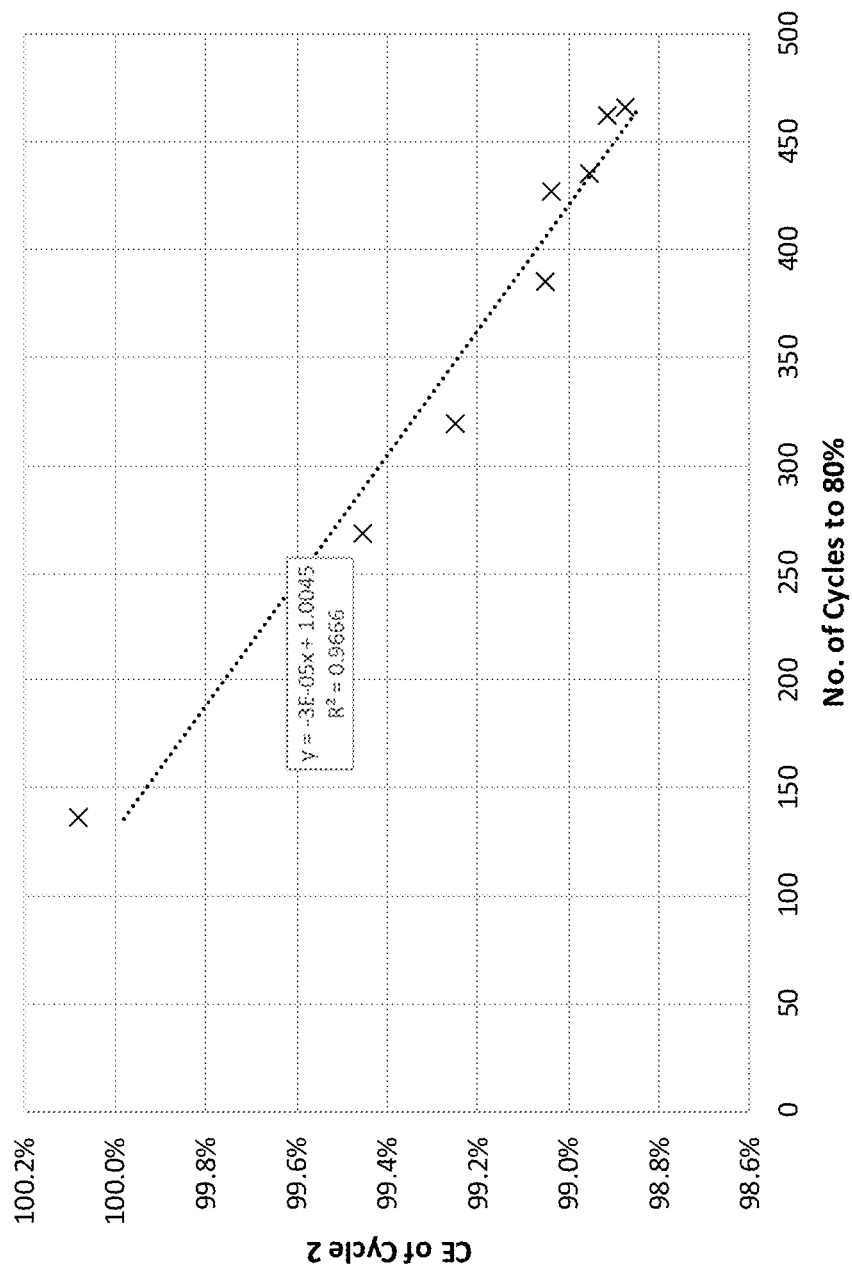
FIGS. 4A-4D illustrates cycle performance predictions versus actual performance for four different systems with different anode and cathode combinations, in accordance with an example embodiment of the disclosure.
Figure 4B:
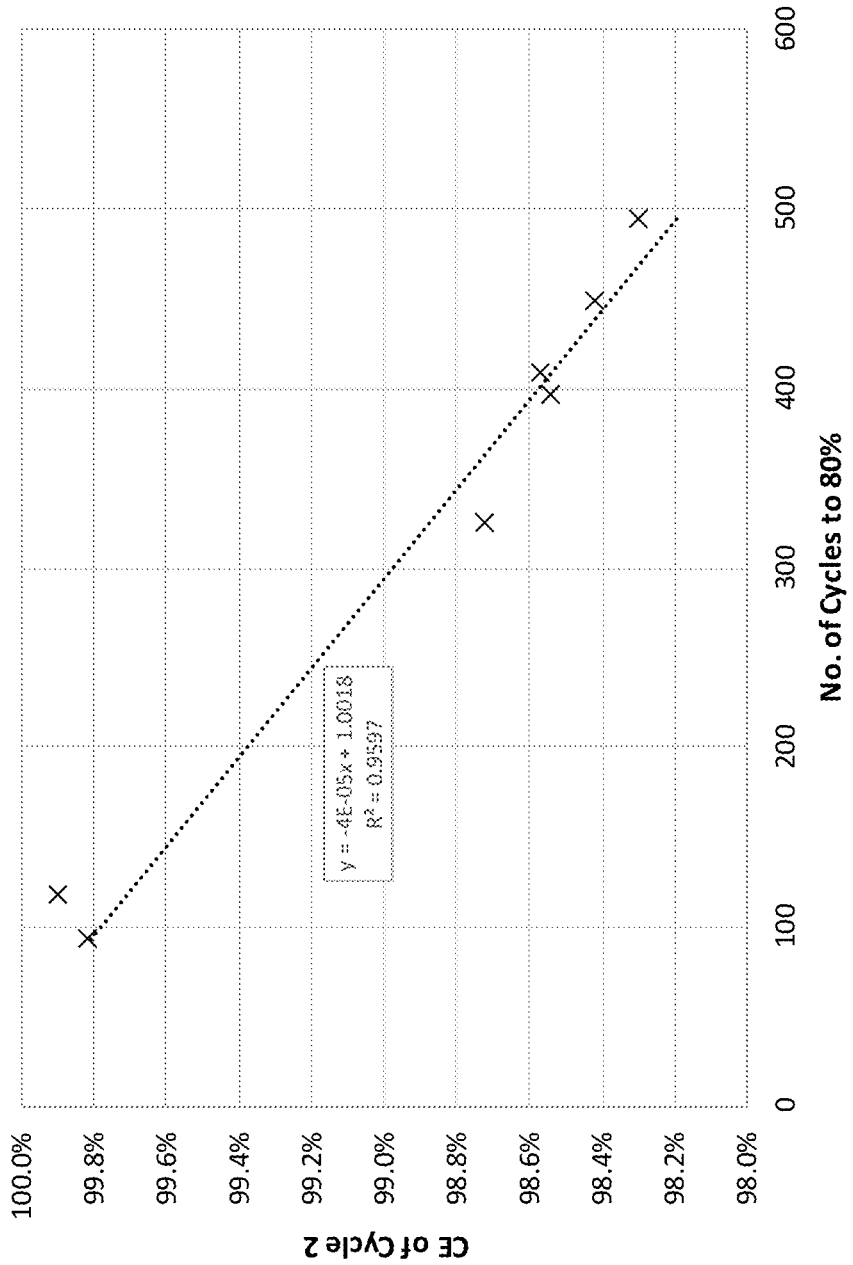

FIG. 4A illustrates data for a cell with a bonded, or laminated anode, as described with respect to FIG. 2A, with an NCA cathode. The plot shows that the coulombic efficiency of the $2^{nd}$ cycle can reasonably predict cycle life with an $R^2$ of 0.9666. FIG. 4B shows data for a bonded anode with NCM811 cathode system. In this case, the coulombic efficiency of the $2^{nd}$ cycle can reasonably predict cycle life with an $R^2$ of 0.9597.

Figure 4C:
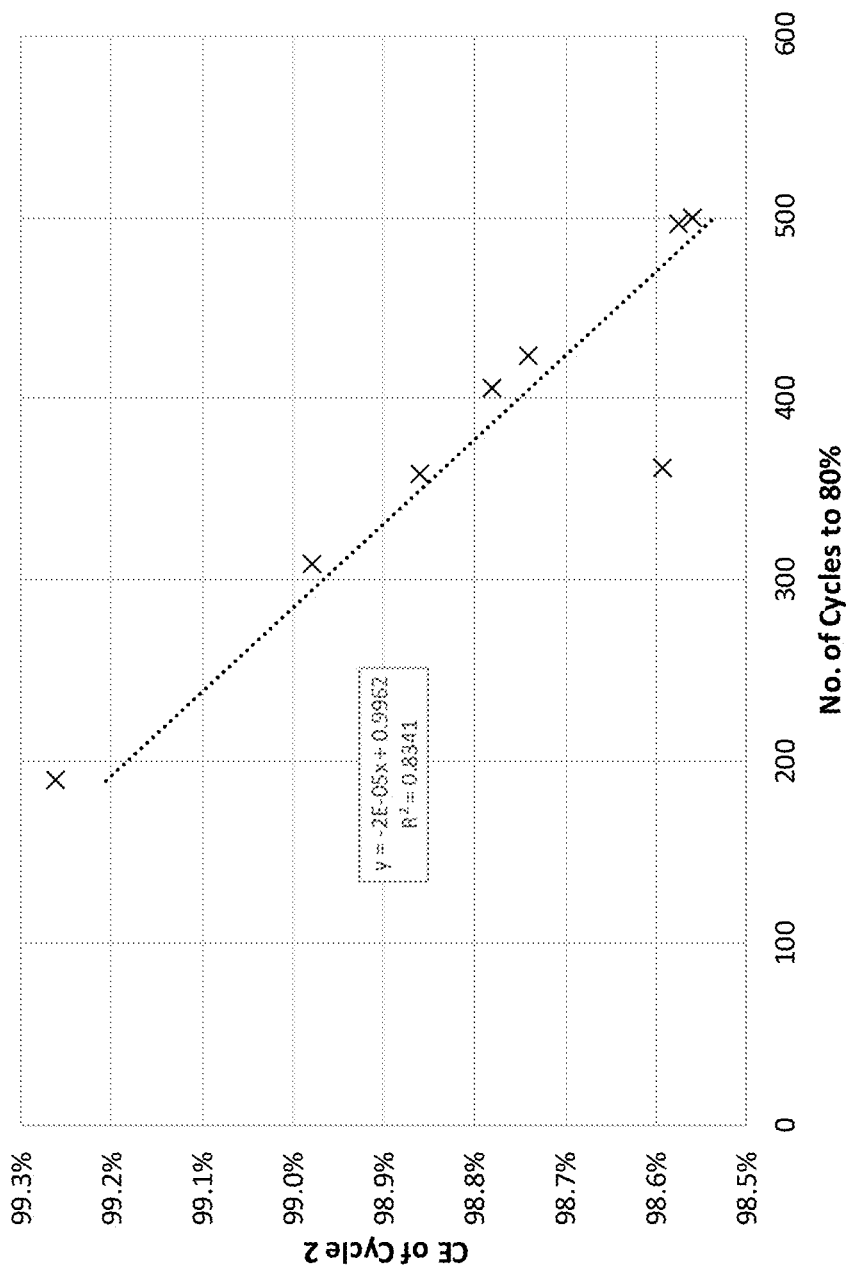
Figure 4D:
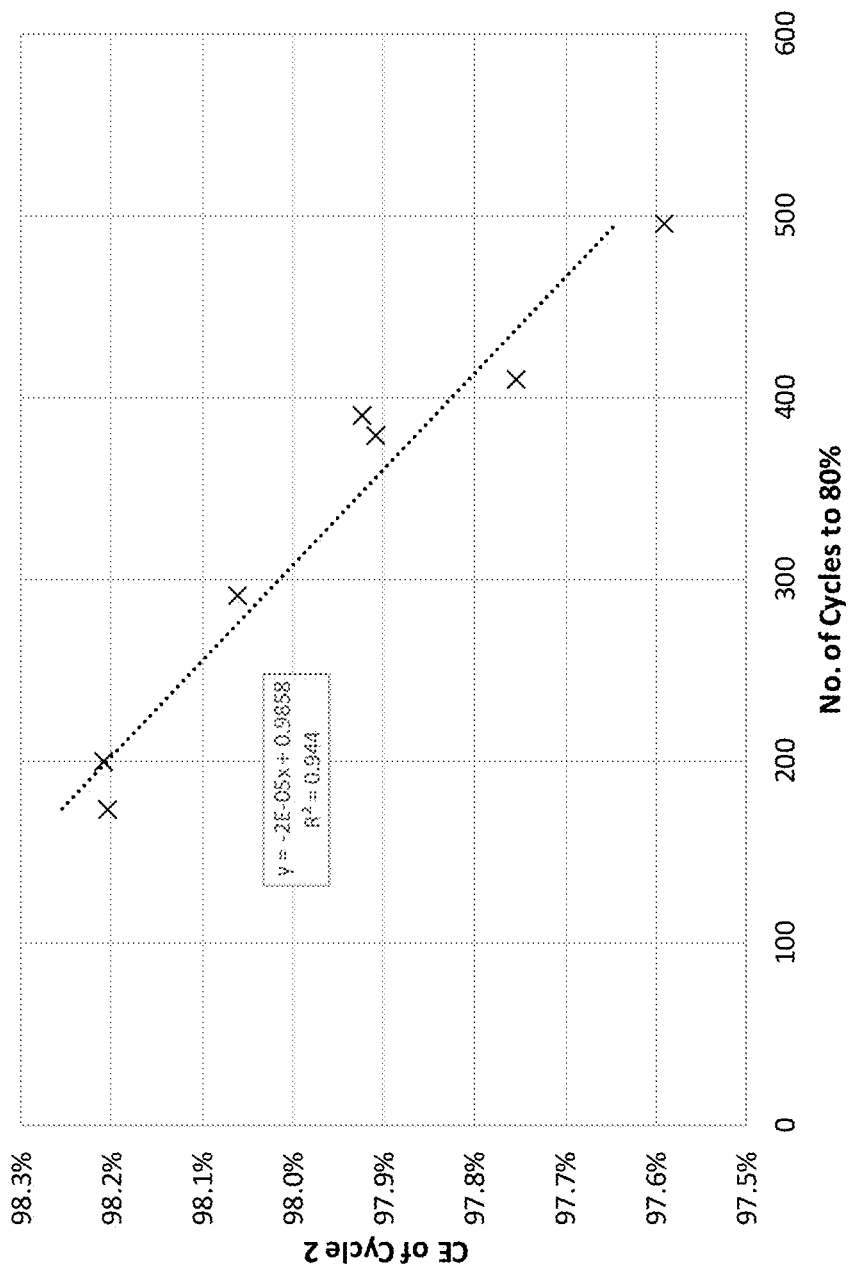

FIG. 4C illustrates data for a cell with a continuous anode, as described with respect to FIG. 2B, with an NCA cathode. In this example, the coulombic efficiency of the $2^{nd}$ cycle can reasonably predict cycle life with $R^2$ of 0.8341 (and an $R^2$ of 0.9983 not including one outlier). Finally, FIG. 4D also illustrates data for a continuous anode but with an NCM811 cathode. With this system, the coulombic efficiency of the $2^{nd}$ cycle can reasonably predict cycle life with an $R^2$ of 0.944.

Each of these plots indicate that a machine learning model considering the $2^{nd}$ cycle coulombic efficiency can accurately predict cell performance, as measured by cycle life, in this case indicated by the number of cycles to reach 80% of the initial capacity.

In an example embodiment of the disclosure, a method and system is described for key predictors and machine learning for configuring cell performance, and may include providing a cell comprising a cathode, a separator, and a silicon-dominant anode; measuring a plurality of parameters of the cell; and using a machine learning model to determine cycle life based on the plurality of measured parameters, where one of the measured parameters comprises second cycle coulombic efficiency, which may be measured during formation and/or cell cycling. The plurality of parameters may include initial coulombic efficiency, cell impedance values, open-circuit voltage, cell thickness, and impedance after degassing.

The plurality of measured parameters may comprise second cycle coulombic efficiency. The plurality of parameters comprise characteristics of cell components or raw materials prior to assembly. The data prior to assembly may comprise, for electrodes, one or more of: loading, conductivity, mechanical strength, wettability, pyrolysis temperature, resin formulation, active material type, and active material particle size. The data prior to assembly may comprise, for electrolytes, one or more of: conductivity, viscosity, and formulation. The data prior to assembly may comprise, for separators: porosity and/or tortuosity.

A first subset of the plurality of parameters may be measured before a formation process. A second subset of the plurality of parameters may be measured during a formation process, where the plurality of parameters may comprise a voltage reached during a first 10% of a first formation cycle. A third subset of the plurality of parameters may be measured during cycling of the cell, where the plurality of parameters may comprise a comparison of two different voltage curves of the cell within a first ten cycles, and where the voltage curves comprise voltage vs. capacity data points that are acquired as the cell is cycled.

The plurality of parameters may comprise a charge capacity of the cell within a first ten cycles and/or a discharge capacity of the cell within a first ten cycles. The cycle life may be defined as a number of cycles to reach 80% of initial capacity. The machine learning model may utilize one or more of the following: logistic regression, lasso regression, AdaBoost regression, AdaBoost classification, XGBoost regression, XGBoost classification, random forest regression, random forest classification, multi-layer perception, long-short-term-memory neural networks, and Bayesian networks. In terms of methodologies, decision tree, linear, neural network, or deep learning can be used. A preferred method may comprise a gradient boosted decision tree algorithm.

As utilized herein the terms "circuits" and "circuitry" refer to physical electronic components (i.e. hardware) and any software and/or firmware ("code") which may configure the hardware, be executed by the hardware, and or otherwise be associated with the hardware. As used herein, for example, a particular processor and memory may comprise a first "circuit" when executing a first one or more lines of code and may comprise a second "circuit" when executing a second one or more lines of code. As utilized herein, "and/or" means any one or more of the items in the list joined by "and/or". As an example, "x and/or y" means any element of the three-element set {(x), (y), (x, y)}. In other words, "x and/or y" means "one or both of x and y". As another example, "x, y, and/or z" means any element of the seven-element set {(x), (y), (z), (x, y), (x, z), (y, z), (x, y, z)}. In other words, "x, y and/or z" means "one or more of x, y and z". As utilized herein, the term "exemplary" means serving as a non-limiting example, instance, or illustration. As utilized herein, the terms "e.g.," and "for example" set off lists of one or more non-limiting examples, instances, or illustrations. As utilized herein, a battery, circuitry or a device is "operable" to perform a function whenever the battery, circuitry or device comprises the necessary hardware and code (if any is necessary) or other elements to perform the function, regardless of whether performance of the function is disabled or not enabled (e.g., by a user-configurable setting, factory trim, configuration, etc.).

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

The invention claimed is:

1. A method of managing battery performance, the method comprising:
providing a cell comprising a cathode, a separator, and a silicon-dominant anode;
obtaining, via a measurement apparatus, measurements of one or more parameters relating to the cell, wherein at least a portion of the measurements of at least one parameter is obtained before formation or cycling of the cell; and
managing the cell based on the one or more parameters, wherein the managing comprises determining cycle life of the cell based on the one or more parameters using a machine learning model;
wherein the measurements of the one or more parameters correspond to a plurality of different types of data, and
wherein amounts of measured data are different for at least two different types of data.

2. The method of claim 1, wherein the one or more parameters comprise initial coulombic efficiency.

3. The method of claim 1, wherein the one or more parameters comprise second cycle coulombic efficiency.

4. The method of claim 1, wherein the one or more parameters comprise at least one parameter related to one or more characteristics of cell components or raw materials prior to assembly.

5. The method of claim 1, wherein the one or more parameters comprise cell impedance values.

6. The method of claim 1, wherein the one or more parameters comprise open-circuit voltage.

7. The method of claim 1, wherein the one or more parameters comprise cell thickness.

8. The method of claim 1, wherein the one or more parameters comprise impedance after degassing.

9. The method of claim 1, further comprising measuring at least one parameter of the one or more parameters before a formation process.

10. The method of claim 1, further comprising measuring at least one parameter of the one or more parameters during a formation process.

11. The method of claim 10, wherein the at least one parameter comprises a voltage reached during a first 10% of a first formation cycle.

12. The method of claim 1, further comprising measuring at least one parameter of the one or more parameters during cycling of the cell.

13. The method of claim 1, wherein the cycle life is defined as a number of cycles to reach 60-80% of initial capacity.

14. The method of claim 1, wherein the machine learning model utilizes one or more of the following: logistic regression, lasso regression, AdaBoost regression, AdaBoost classification, XGBoost regression, XGBoost classification, random forest regression, random forest classification, multi-layer perception, long-short-term-memory neural networks, and Bayesian networks.

* * * * *